United States Patent
Lee et al.

(10) Patent No.: US 8,710,358 B2
(45) Date of Patent: Apr. 29, 2014

(54) SOLAR CELL USING POLYMER-DISPERSED LIQUID CRYSTALS

(75) Inventors: Gae-hwang Lee, Hwaseong-si (KR); Kyu-young Hwang, Ansan-si (KR); Jae-eun Jung, Seoul (KR)

(73) Assignee: Samsung Electronics, Co. Ltd., Suwon-si, Gyeonggi-do ( * ) Notice: Subject to any disclaimer, the term of this patent is extended or adjusted under 35 U.S.C. 154(b) by 95 days.

(21) Appl. No.: 13/204,210

(22) Filed: Aug. 5, 2011

(65) Prior Publication Data

US 2012/0260979 A1   Oct. 18, 2012

(30) Foreign Application Priority Data

Apr. 13, 2011   (KR) .................. 10-2011-0034416

(51) Int. Cl.
*H01L 31/00* (2006.01)

(52) U.S. Cl.
USPC ........... 136/257; 136/252; 136/256; 136/259; 349/116; 349/25; 349/24

(58) Field of Classification Search
USPC ................. 136/243–265; 349/1–202
See application file for complete search history.

(56) References Cited

U.S. PATENT DOCUMENTS

| | | | | |
|---|---|---|---|---|
| 5,132,814 A * | 7/1992 | Ohkouchi et al. | | 349/27 |
| 5,139,578 A * | 8/1992 | Valley | | 136/257 |
| 5,482,571 A * | 1/1996 | Yamada et al. | | 136/259 |
| 5,604,612 A * | 2/1997 | Coates et al. | | 349/86 |
| 5,673,127 A * | 9/1997 | Takahara et al. | | 349/140 |
| 5,686,017 A * | 11/1997 | Kobayashi et al. | | 252/299.01 |
| 5,807,440 A * | 9/1998 | Kubota et al. | | 136/256 |
| 5,963,283 A * | 10/1999 | Omae et al. | | 349/86 |
| 7,206,044 B2 * | 4/2007 | Li et al. | | 349/113 |
| 2003/0081158 A1 * | 5/2003 | Li et al. | | 349/113 |
| 2005/0150540 A1 * | 7/2005 | Li et al. | | 136/246 |
| 2007/0199591 A1 * | 8/2007 | Harder et al. | | 136/252 |
| 2009/0027872 A1 * | 1/2009 | Debije et al. | | 362/84 |
| 2010/0096006 A1 * | 4/2010 | Griffiths et al. | | 136/256 |
| 2010/0139769 A1 * | 6/2010 | Mapel | | 136/259 |
| 2011/0023947 A1 | 2/2011 | Inoue et al. | | |

FOREIGN PATENT DOCUMENTS

| | | |
|---|---|---|
| JP | 2002064213 A | 2/2002 |
| JP | 2002314102 A | 10/2002 |
| KR | 20090034109 A | 4/2009 |
| KR | 20110014326 A | 2/2011 |

OTHER PUBLICATIONS

Spruce, G., et al. "Polymer dispersed liquid crystal (PDLC) films." Electronics & Communication Engineering Journal, Apr. 1992, p. 91.*

(Continued)

*Primary Examiner* — James Lin
*Assistant Examiner* — Liesl C Baumann
(74) *Attorney, Agent, or Firm* — Harness, Dickey & Pierce, P.L.C.

(57) ABSTRACT

Example embodiments relate to a solar cell configured to scatter incident light to be penetrated so as to increase a light progress path and includes a polymer-dispersed liquid crystal (PDLC) layer on at least one of a first and a second electrodes.

17 Claims, 4 Drawing Sheets

(56) References Cited

OTHER PUBLICATIONS

Lampert, C.M. "Smart switchable glazing for solar energy and daylight control." Solar Energy Materials and Solar Cells 52 (1998) 207-221.*

Gao, W. et al. "First a-SiC:H photovoltaic-powered monolithic tandem electrochromic smart window device." Solar Energy Materials and Solar Cells 59 (1999) 243-254.*

Gao et al. "Approaches for large-area a-SiC:H photovoltaic-powered electrochromic window coatings." Journal of Non-Crystalline Solids, 2000, pp. 1140-1144.*

Ito et al. "Conductive and Transparent Multilayer Films for Low-Temperature-Sintered Mesoporous TiO2 Electrodes of Dye-Sensitized Solar Cells." Chem. Mater. 2003, p. 2826.*

Baetens et al. "Properties, requirements and possibilities of smart windows for dynamic daylight and solar energy control in buildings: A state-of-the-art review." Solar Energy Materials & Solar Cells, 2010, 87-105.*

Chen et al. "Integration of a-Si:H solar cell with novel twist nematic liquid crystal cell for adjustable brightness and enhanced power characteristics." Solar Energy MAterials & SOlar Cells, 2009, 1268-1275.*

* cited by examiner

SOLAR CELL USING POLYMER-DISPERSED LIQUID CRYSTALS

CROSS-REFERENCE TO RELATED APPLICATION

This application claims priority under 35 U.S.C. §119 to the benefit of Korean Patent Application No. 10-2011-0034416, filed on Apr. 13, 2011, in the Korean Intellectual Property Office, the contents of which is incorporated herein in its entirety by reference.

BACKGROUND

1. Field

Example embodiments relate to solar cells, and more particularly, to solar cells using polymer-dispersed liquid crystals.

2. Description of the Related Art

Some solar cells convert solar energy into electric energy by using a p-type semiconductor material and an n-type semiconductor material. When sunlight is incident on a solar cell, electrons and holes are generated from n- and p-type semiconductor materials, and the generated electrons and holes move to n- and p-type electrodes. Accordingly, current flows in a load connected to the solar cell. Solar cells may not only generate electrical energy, but solar cells also can suppress environmental pollution, such as greenhouse gases, because solar cells generate electricity without producing greenhouse gases. Thus, there is interest in highly efficient solar cells.

Thin-film solar cells include a semiconductor material having a thickness of about a few microns or less. When the thickness of a thin film solar cell decreases, the efficiency of the solar cell may increase due to a reduction in dark current and carrier recombination. However, because a thickness of a semiconductor material decreases, the efficiency of the solar cell may decrease as the solar cell may absorb less sunlight. Accordingly, methods of reducing a thickness of a solar cell and improving absorption of sunlight are desired in order to improve the efficiency of the solar cell. In order to improve the absorption of sunlight, scattering materials such as photonic crystals or nanoparticles may be used to induce light scattering and thus a progress path of the sunlight may increase in the solar cell. However, a manufacturing process of the solar cell using photonic crystals and/or nanoparticles may be complex and thus add to manufacturing costs.

SUMMARY

Example embodiments relate to solar cells including polymer-dispersed liquid crystals.

Additional aspects will be set forth in part in the description which follows and, in part, will be apparent from the description, or may be learned by practice of example embodiments.

According to example embodiments, a solar cell includes a first electrode and a second electrode spaced apart from each other, a semiconductor layer between the first electrode and the second electrode, and a polymer-dispersed liquid crystal (PDLC) layer on at least one of the first and second electrodes, the PDLC layer comprising a polymer and liquid crystals.

An anti-reflection layer may be on the PDLC layer.

The PDLC layer may further include wavelength conversion materials. The wavelength conversion materials may include at least one of quantum dots and fluorescent dye.

The semiconductor layer may include a p-type semiconductor layer and an n-type semiconductor layer.

According to example embodiments, a solar cell includes a first electrode and a second electrode spaced apart from each other, a semiconductor layer between the first electrode and the second electrode, and a first polymer-dispersed liquid crystal (PDLC) layer on the first electrode, the first PDLC layer comprising a polymer and liquid crystals.

An anti-reflection film may be on the first PDLC layer.

The first PDLC layer may further include wavelength conversion materials. The wavelength conversion materials may include at least one of quantum dots and fluorescent dye.

The first electrode may include a light-transmitting material and the second electrode may include a light-reflective material.

The first and second electrodes may each include a light-transmitting material. The solar cell may further include a second PDLC formed on the second electrode layer, the second PDLC layer comprising a polymer and liquid crystals.

According to example embodiments, a solar cell, configured to scatter incident light to be penetrated so as to increase a sunlight progress path, includes a polymer-dispersed liquid crystal (PDLC) layer including a polymer and liquid crystals.

An anti-reflection film may be on the PDLC layer.

The PDLC layer may further include wavelength conversion materials.

The solar cell may include one of a thin film solar cell, a compound semiconductor solar cell, a dye-sensitized solar cell (DSSC), and an organic photovoltaic (OPV) solar cell.

BRIEF DESCRIPTION OF THE DRAWINGS

The foregoing and/or other features and advantages of example embodiments will be apparent and more readily appreciated from the following description of the non-limiting embodiments, taken in conjunction with the accompanying drawings in which like reference characters refer to the same parts throughout the different views. The drawings are not necessarily to scale, emphasis instead being placed upon illustrating the principles of example embodiments. In the drawings.

DETAILED DESCRIPTION

Figure 1:
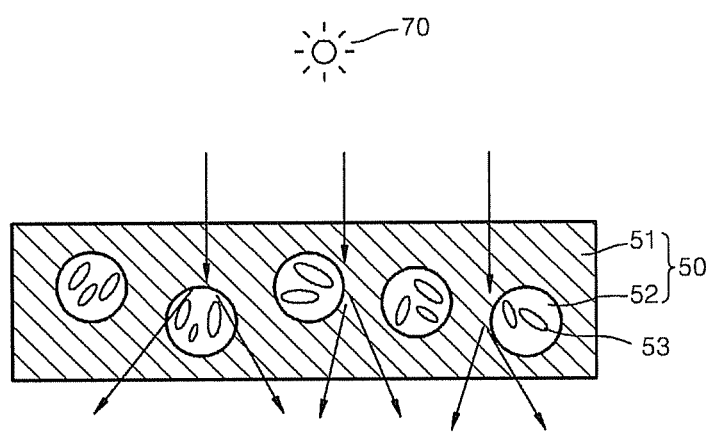
FIG. 1 illustrates a structure and optical characteristics of a polymer-dispersed liquid crystal (PDLC) layer.

Example embodiments will now be described more fully with reference to the accompanying drawings, in which some example embodiments are shown. Example embodiments, may, however, be embodied in many different forms and should not be construed as being limited to the embodiments set forth herein; rather, these example embodiments are provided so that this disclosure will be thorough and complete, and will fully convey concepts of example embodiments to those of ordinary skill in the art. In the drawings, the thicknesses of layers and regions are exaggerated for clarity. Like reference numerals in the drawings denote like elements, and thus their description will be omitted.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. As used herein the term "and/or" includes any and all combinations of one or more of the associated listed items. Other words used to describe the relationship between elements or layers should be interpreted in a like fashion (e.g., "between" versus "directly between," "adjacent" versus "directly adjacent," "on" versus "directly on").

It will be understood that, although the terms "first", "second", etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of example embodiments.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises", "comprising", "includes" and/or "including," if used herein, specify the presence of stated features, integers, steps, operations, elements and/or components, but do not preclude the presence or addition of one or more other features, integers, steps, operations, elements, components and/or groups thereof.

Example embodiments are described herein with reference to cross-sectional illustrations that are schematic illustrations of idealized embodiments (and intermediate structures) of example embodiments. As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. For example, an implanted region illustrated as a rectangle may have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of example embodiments.

Unless otherwise defined, all terms (including technical and scientific terms) used herein have the same meaning as commonly understood by one of ordinary skill in the art to which example embodiments belong. It will be further understood that terms, such as those defined in commonly-used dictionaries, should be interpreted as having a meaning that is consistent with their meaning in the context of the relevant art and will not be interpreted in an idealized or overly formal sense unless expressly so defined herein.

FIG. 1 illustrates a structure and optical characteristics of a polymer-dispersed liquid crystal (PDLC) layer 50. Referring to FIG. 1, the PDLC layer 50 may include a polymer 51 and liquid crystals 52. Here, the polymer 51 has a network structure, and the liquid crystals 52 are uniformly (or substantially uniformly) dispersed in the polymer 51. When an electric field is not applied to the PDLC layer 50, liquid crystal molecules 53 are arranged randomly in the PDLC layer 50. As such, while the liquid crystal molecules 53 are randomly arranged, light incident onto the PDLC layer 50 from an optical source 70 is scattered in various directions due to a difference in refractive indices between the polymer 51 and the liquid crystals 52. The scattered light mostly penetrates the PDLC layer 50 and is hardly reflected toward the optical source 70. As such, in the PDLC layer 50, to which an electric field is not applied, the characteristics of the PDLC layer 50 are that incident light scatters and penetrates. Accordingly, when the PDLC layer 50 is applied as a light-scattering layer in a solar cell, paths in which the sunlight progresses may increase in a solar cell.

Figure 2:
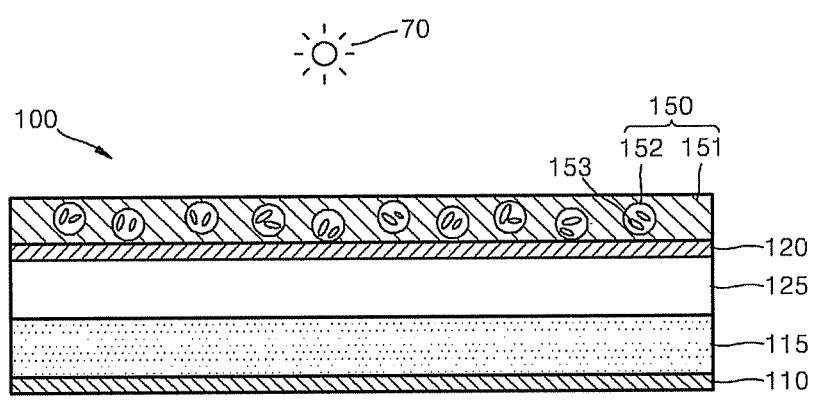
FIG. 2 is a cross-sectional view schematically illustrating a solar cell according to example embodiments.

FIG. 2 is a cross-sectional view schematically illustrating a solar cell 100 according to example embodiments.

Referring to FIG. 2, a first electrode 120 and a second electrode 110 are spaced apart from each other by a desired (or alternatively predetermined) interval. Also, semiconductor layers 125 and 115, which generate electrons and holes due to the sunlight incident from the optical source 70, are interposed between the first electrode 120 and the second electrode 110. Although FIG. 2 illustrates a solar cell 100 facing sunlight incident from the optical source 70, example embodiments are not limited thereto and solar cells according to example embodiments may generate electricity from non-solar light radiation. The first electrode 120 is on a side where the sunlight is incident from the optical source 70 and may include a light-transmitting material. Also, the second electrode 110 may include a light-reflective material such as a metal that reflects light. Alternatively, the second electrode 110 may include a light-transmitting material. The semiconductor layers 125 and 115 may include a first semiconductor layer 125 formed on the lower surface of the first electrode 120 and a second semiconductor layer 115 formed on the lower surface of the first semiconductor layer 125, respectively. The first and second semiconductor layers 125 and 115 may be an n-type semiconductor layer and a p-type semiconductor layer, respectively. In this case, the first and second electrodes 120 and 110 may be an n-type electrode and a p-type electrode, respectively. Also, the first and second semiconductor layers 125 and 115 may be p-type semiconductor layer and an n-type semiconductor layer, respectively. In this case, the first and second electrodes 120 and 110 may be p-type electrode and an n-type electrode.

A PDLC layer 150 is formed on the first electrode 120, on which the sunlight is incident from the optical source 70. The PDLC layer 150 includes a polymer 151 and liquid crystals 152 dispersed in the polymer 151. Here, the polymer 151 may have a network structure, and liquid crystal molecules 153 are arranged randomly in the PDLC layer 150.

The PDLC layer 150 may be formed as follows. First, a transparent substrate (not illustrated) such as glass is formed on the first electrode 120 and then, a solution obtained by mixing the liquid crystals 152 and a photopolymerizable material (not illustrated) is injected between the transparent substrate and the first electrode 120. Then, when UV light is irradiated to the mixture solution through the transparent substrate, the photopolymerizable material is hardened by a photo-polymerization reaction, thereby forming the PDLC layer 150. As such, after the PDLC layer 150, the transparent substrate may be removed or may remain on the PDLC layer 150. Also, the PDLC layer 150 may be formed by manufacturing a PDLC film (not illustrated) by a roll-to-roll method and then attaching the PDLC film on the first electrode 120.

In the above structure, when the sunlight is incident onto the PDLC layer 150 from the optical source 70, the sunlight is scattered in various directions due to a difference in refractive indices between the polymer 151 and the liquid crystals 152 and mostly penetrates the PDLC layer 150. The light penetrating the PDLC layer 150 is incident onto the first and second semiconductor layers 125 and 115 through the first electrode 120. The light incident onto the first and second semiconductor layers 125 and 115 is absorbed while passing the first and second semiconductor layers 125 and 115 and generates electrons and holes. As such, when the PDLC layer 150 is disposed at a side where the sunlight is incident, light incident onto the PDLC layer 150 is scattered in various directions and mostly penetrates the PDLC layer 150. Accordingly, a progress path of light incident onto the first and second semiconductor layers 120 and 110 may increase. Due to the increase in the progress path of light in the first and second semiconductor layers 125 and 115, the first and second semiconductor layers 125 and 115 may absorb an increased amount of light and thus the efficiency of the solar cell 100 may increase. Also, the PDLC layer 150 may further include nano-scattered particles (not illustrated) for improving a scattering characteristic.

Figure 3A:
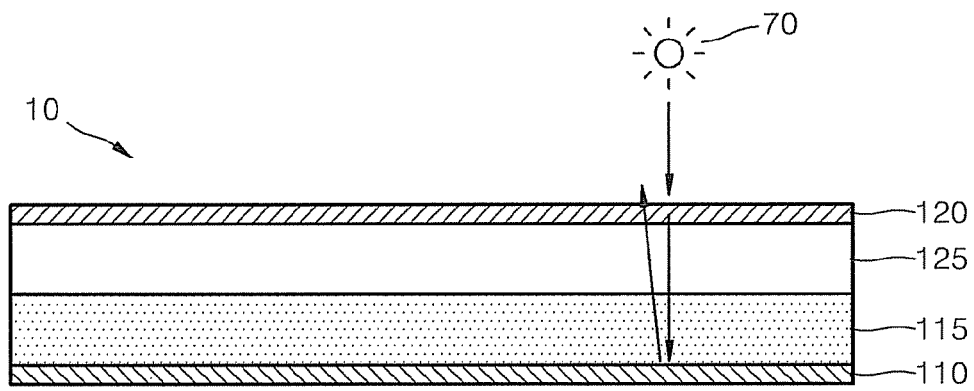
FIGS. 3A and 3B are cross-sectional views illustrating a sunlight progress path in a conventional art solar cell and a sunlight progress path in a solar cell according to example embodiments, respectively.
Figure 3B:
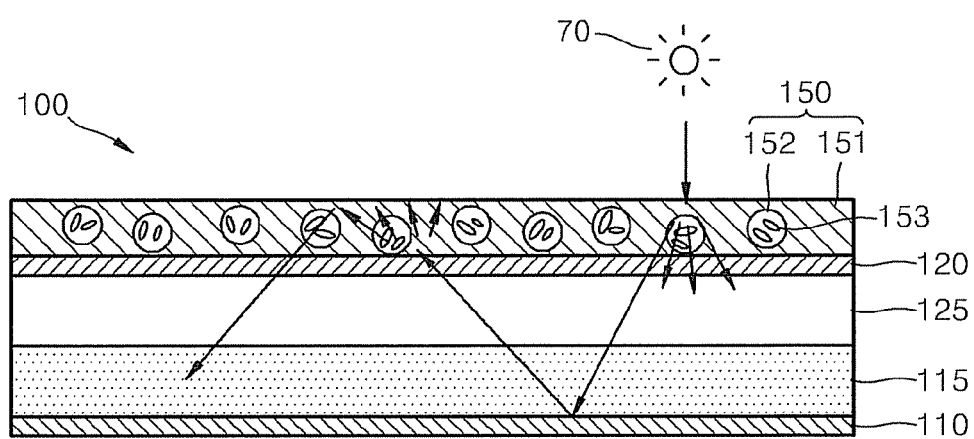

FIGS. 3A and 3B are cross-sectional views illustrating a sunlight progress path in a conventional art solar cell 10 and a sunlight progress path in the solar cell 100 according to example embodiments, respectively. More specifically, FIG. 3A illustrates a conventional art solar cell 10 in which first and second semiconductor layers 125 and 115 are interposed between a first electrode 120 and a second electrode 110 that are spaced apart from each other and FIG. 3B illustrates the solar cell 100 according to example embodiments.

Referring to FIG. 3A, in the conventional art solar cell 10, the sunlight perpendicularly incident on the solar cell 10 from the optical source 70 penetrates the first electrode 120, is incident onto the first and second semiconductor layers 125 and 115, is reflected toward the optical source 70 by the second electrode 110, and is emitted to the outside. In this case, the sunlight in the solar cell 10 may have a progress path that is twice the thickness of the solar cell 10.

Referring to FIG. 3B, in the solar cell 100, the sunlight incident on the PDLC layer 150 from the optical source 70 scatters in various directions due to a difference in refractive indices between the polymer 151 and the liquid crystals 152 and mostly penetrates the PDLC layer 150. The penetrated light is incident onto the first and second semiconductor layers 125 and 115 through the first electrode 120. Also, light that is not absorbed from among the light incident onto the first and second semiconductor layers 125 and 115 is reflected in various angles by the second electrode 110 and may be incident again on the PDLC layer 150 through the first electrode 120. As such, light incident on the PDLC layer 150 is again scattered in various directions and a part of the light penetrates the PDLC layer 150 and emits to the outside and the other part of the light enters again into the first and second semiconductor layers 125 and 115 by total reflection occurring due to a difference in refractive indices between the PDLC layer 150 and air outside. As described above, in the solar cell 100 according to example embodiment, the PDLC layer 150 is used to scatter the sunlight in various directions and the scattered light is incident to the first and second semiconductor layers 125 and 115, thereby increasing the sunlight progress path in the solar cell 100. Accordingly, the first and second semiconductor layers 125 and 115 may absorb an increased amount of light and thus the efficiency of the solar cell 100 may increase.

Figure 4:
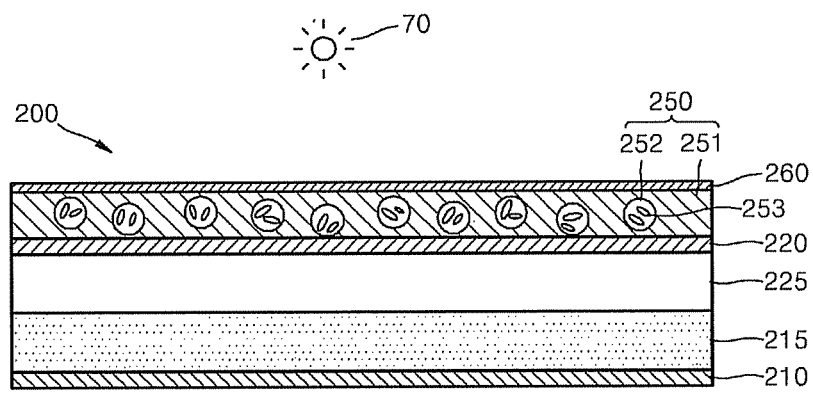
FIG. 4 is a cross-sectional view of a solar cell according to example embodiments.

FIG. 4 is a cross-sectional view of a solar cell 200 according to example embodiments. Hereinafter, differences from the solar cell 100 will be described.

Referring to FIG. 4, a first electrode 220 and a second electrode 210 are disposed to be spaced apart from each other by a desired (or alternatively predetermined) interval, and first and second semiconductor layers 225 and 215 are interposed between the first electrode 220 and the second electrode 210. The first electrode 220 may include a light-transmitting material and the second electrode 210 may include a light-reflective material. Also, a PDLC layer 250 is formed on the first electrode 220, onto which the sunlight is incident from the optical source 70. The PDLC layer 250 includes a polymer 251 and liquid crystals 252 that are uniformly dispersed in the polymer 251. Here, liquid crystal molecules 253 are arranged randomly in the PDLC layer 250. The PDLC layer 250 may further include nano-scattered particles (not illustrated) for improving a scattering characteristic.

An anti-reflection film 260 is coated on the PDLC layer 250. The anti-reflection film 260 prevents the sunlight incident from the optical source 70 from being reflected at the interface between air outside and the PDLC layer 250. As described above, in the solar cell 200, the anti-reflection film 260 is coated on the PDLC layer 250 and thus an increased amount of the sunlight from the optical source 70 may be incident onto the PDLC layer 250.

Figure 5:
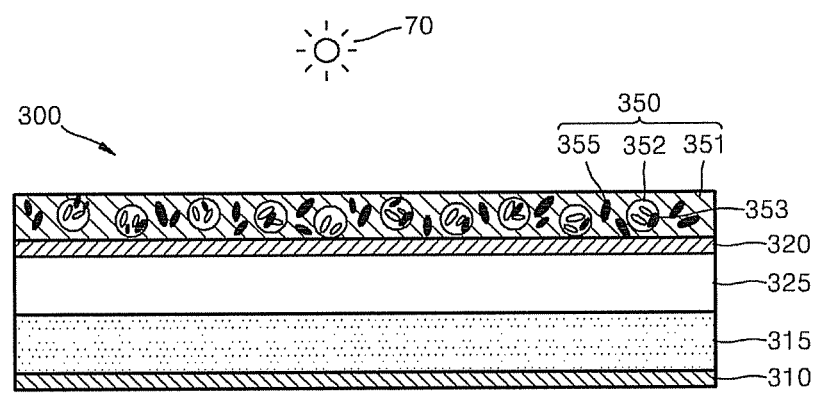
FIG. 5 is a cross-sectional view of a solar cell according to example embodiments.

FIG. 5 is a cross-sectional view of a solar cell 300 according to example embodiments. Hereinafter, differences from the solar cells 100 and 200 will be described.

Referring to FIG. 5, a first electrode 320 and a second electrode 310 are disposed to be spaced apart from each other by a desired (or alternatively predetermined interval), and first and second semiconductor layers 325 and 315 are interposed between the first electrode 320 and the second electrode 310. The first electrode 320 may include a light-transmitting material and the second electrode 310 may include a light-reflective material. Also, a PDLC layer 350 is formed on the first electrode 320, onto which the sunlight is incident from the optical source 70. In the solar cell 300, the PDLC layer 350 includes a polymer 351, liquid crystals 352, and wavelength conversion materials 355. Here, the liquid crystals 352 and the wavelength conversion materials 355 are dispersed in the polymer 351 having a network structure. The wavelength conversion materials 355 may convert the wavelength of incident light. The wavelength conversion materials 355 may include quantum dots, fluorescent dye, and combinations thereof, but example embodiments are not limited thereto. Liquid crystal molecules 353 are arranged randomly in the PDLC layer 350. The PDLC layer 350 may further include nano-scattered particles (not illustrated) for improving a scattering characteristic.

In general, in a solar cell, a wavelength band of the sunlight which may be used according to the type of used semiconductor material exists and thus the sunlight having a wavelength that is not in the wavelength band is not changed by electric power by the solar cell. However, as in the solar cell 300 according to the example embodiments, when the wavelength conversion materials 355 are included in the PDLC layer 350, the sunlight having a wavelength, which is not usable, in the sunlight incident from the optical source 70 is changed to the sunlight having a wavelength, which is usable, by the wavelength conversion materials 355 and thus the efficiency of the solar cell 300 may be increased. Also, the anti-reflection film 260 illustrated in FIG. 4 may be further formed on the PDLC layer 350.

Figure 6:
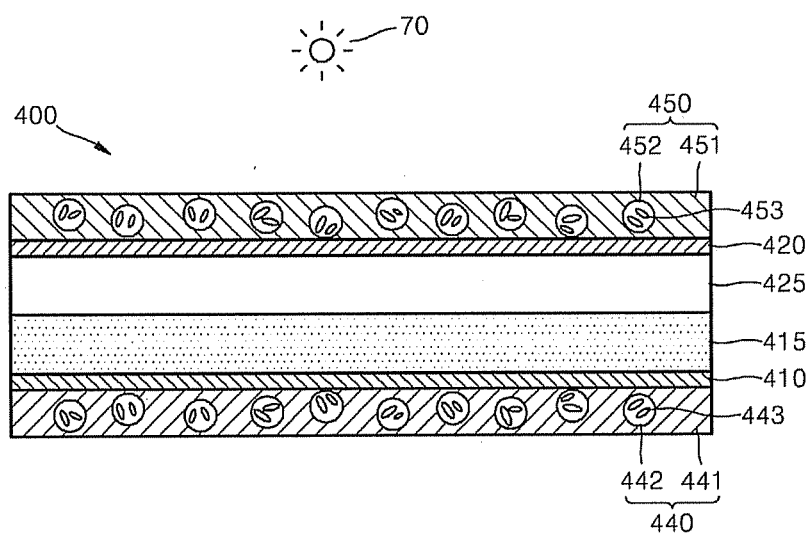
FIG. 6 is a cross-sectional view of a solar cell according to example embodiments.

FIG. 6 is a cross-sectional view of a solar cell 400 according to example embodiments. Hereinafter, differences from the solar cells 100, 200, and 300 will be described.

Referring to FIG. 6, a first electrode 420 and a second electrode 410 are disposed to be spaced apart from each other by a desired (or alternatively predetermined) interval, and first and second semiconductor layers 425 and 415 are interposed between the first electrode 420 and the second electrode 410. The first electrode 420 and the second electrode 410 may each include a light-transmitting material. A first PDLC layer 450 is formed on the first electrode 420, onto which the sunlight is incident from the optical source 70. The first PDLC layer 450 includes a first polymer 441 and first liquid crystals 452 dispersed in the first polymer 451. First liquid crystal molecules 453 are arranged randomly in the first PDLC layer 450. The first PDLC layer 450 may further include nano-scattered particles (not illustrated) for improving a scattering characteristic. Also, a second PDLC layer 440 is disposed on the lower surface of the second electrode 410. Here, the second PDLC layer 440 includes a second polymer 441 and second liquid crystals 442 dispersed in the second polymer 441. Second liquid crystal molecules 443 are arranged randomly in the second PDLC layer 440. The second PDLC layer 440 may further include nano-scattered particles (not illustrated) for improving a scattering characteristic.

In the above structure, the sunlight incident onto the first PDLC layer 450 from the optical source 70 is scattered in various directions and mostly penetrates the first PDLC layer 450. The light penetrating the first PDLC layer 450 is incident onto the first and second semiconductor layers 425 and 415. Also, light that is not absorbed from among the light incident onto the first and second semiconductor layers 425 and 415 is incident onto the second PDLC layer 440 through the second electrode 410. As such, light incident onto the second PDLC layer 440 is scattered in various directions and a part of the light is again incident onto the first and second semiconductor layers 425 and 415. Accordingly, the solar cell 400 according to the current embodiment absorbs an increased amount of the sunlight incident from the optical source 70 and thus the efficiency of the solar cell 400 may be increased. Also, the anti-reflection film 260 illustrated in FIG. 4 may be further formed on the first PDLC layer 450, onto which the sunlight is incident from the optical source 70. Also, the wavelength conversion materials 355 illustrated in FIG. 5 may be further included in the first and second PDLC layers 450 and 440.

Figure 7:
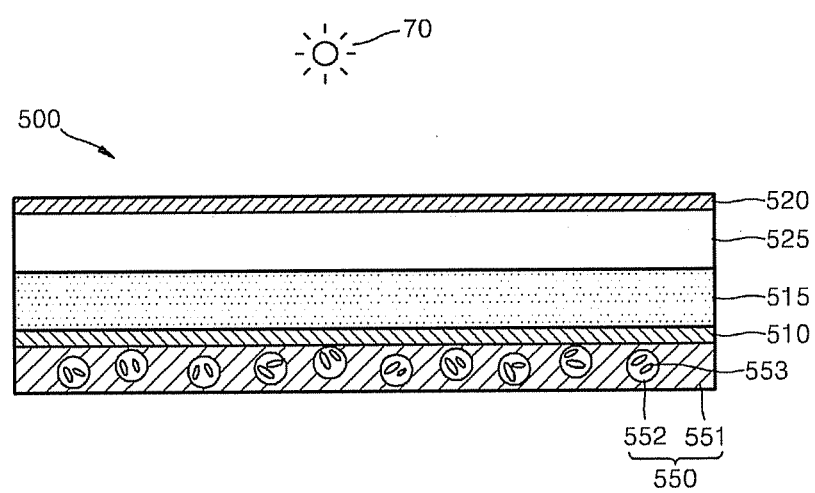
FIG. 7 is a cross-sectional view of a solar cell according to example embodiments.

FIG. 7 is a cross-sectional view of a solar cell 500 according to example embodiments. Hereinafter, differences from the solar cells 100, 200, 300, and 400 will be described.

Referring to FIG. 7, a first electrode 520 and a second electrode 510 are disposed to be spaced apart from each other by a predetermined interval, and first and second semiconductor layers 525 and 515 are interposed between the first electrode 520 and the second electrode 510. The first electrode 520 and the second electrode 510 may each include a light-transmitting material. A PDLC layer 550 is formed on the lower surface of the second electrode 510. The PDLC layer 550 includes a polymer 551 and liquid crystals 552 dispersed in the polymer 551. Liquid crystal molecules 553 are arranged randomly in the PDLC layer 550. The first PDLC layer 550 may further include nano-scattered particles (not illustrated) for improving a scattering characteristic.

In the above structure, the sunlight is incident onto the first and second semiconductor layers 525 and 515 through the first electrode 520 from the optical source 70. Also, light that is not absorbed in the incident light is incident onto the PDLC layer 550 through the second electrode 510. Light incident onto the PDLC layer 550 is scattered in various directions and a part of the light is again incident onto and is absorbed in the first and second semiconductor layers 525 and 515. In addition, the anti-reflection film 260 illustrated in FIG. 4 may be further formed on the first electrode 520, onto which the sunlight is incident from the optical source 70, and the wavelength conversion materials 355 illustrated in FIG. 5 may be further included in the PDLC layer 550.

According to example embodiments, a PLDC layer, as a light-scattering layer, is applied in a solar cell so that the sunlight incident from the optical source is efficiently scattered and penetrates the PLDC layer and thus the sunlight progress path may be increased in the solar cell, thereby improving the efficiency of the solar cell.

A solar cell, in which a PDLC layer described in the above embodiments is used as a light-scattering layer, may be applied to all types of solar cells, for example, a thin film solar cell, a compound semiconductor solar cell, a dye-sensitized solar cell (DSSC), or an organic photovoltaic (OPV) solar cell.

It should be understood that the example embodiments described herein should be considered in a descriptive sense only and not for purposes of limitation. Descriptions of features or aspects within example embodiments should typically be considered as available for other similar features or aspects in other example embodiments. While some, example embodiments have been particularly shown and described, it will be understood by one of ordinary skill in the art that variations in form and detail may be made therein without departing from the spirit and scope of the claims.

What is claimed is:

1. A solar cell comprising:
   a first electrode and a second electrode spaced apart from each other;
   a semiconductor layer between the first electrode and the second electrode; and
   a polymer-dispersed liquid crystal (PDLC) layer on at least one of the first and second electrodes, the PDLC layer comprising a polymer and liquid crystals; and
   an anti-reflection film in direct physical contact on the PDLC layer,
   wherein the PDLC layer scatters an incident light to be penetrated to increase a light path in the semiconductor layer.

2. The solar cell of claim 1, wherein the PDLC layer includes wavelength conversion materials.

3. The solar cell of claim 1, wherein the semiconductor layer comprises a p-type semiconductor layer and an n-type semiconductor layer.

4. A solar cell comprising:
a first electrode and a second electrode spaced apart from each other;
a semiconductor layer between the first electrode and the second electrode; and
a first polymer-dispersed liquid crystal (PDLC) layer on the first electrode, the first PDLC layer comprising a polymer and liquid crystals; and
an anti-reflection film in direct physical contact on the first PDLC layer,
wherein the first PDLC layer scatters an incident light to be penetrated to increase a light path in the semiconductor layer.

5. The solar cell of claim 4, wherein the first PDLC layer further comprises wavelength conversion materials.

6. The solar cell of claim 5, wherein the wavelength conversion materials comprise at least one of quantum dots and fluorescent dye.

7. The solar cell of claim 4, wherein
the first electrode comprises a light-transmitting material, and
the second electrode comprises a light-reflective material.

8. The solar cell of claim 4, wherein the first and second electrodes each comprise a light-transmitting material.

9. The solar cell of claim 8, further comprising a second PDLC layer formed on the second electrode layer, the second PDLC layer comprising a polymer and liquid crystals.

10. The solar cell of claim 4, wherein the semiconductor layer comprises a p-type semiconductor layer and an n-type semiconductor layer.

11. A solar cell, configured to scatter the incident light to be penetrated so as to increase a light progress path, comprising:
a polymer-dispersed liquid crystal (PDLC) layer including a polymer and liquid crystals; and
an anti-reflection film in direct physical contact on the PDLC layer,
wherein the PDLC layer is on the solar cell.

12. The solar cell of claim 11, wherein the PDLC layer further comprises wavelength conversion materials.

13. The solar cell of claim 11, wherein the solar cell includes one of a thin film solar cell, a compound semiconductor solar cell, a dye-sensitized solar cell (DSSC) and an organic photovoltaic (OPV) solar cell.

14. The solar cell of claim 1, wherein the PDLC layer is a first PDLC layer on the first electrode, and the solar cell further includes a second PDLC layer that supports the second electrode.

15. The solar cell of claim 4, further comprising:
a second PDLC layer that supports the second electrode.

16. The solar cell of claim 11, further comprising:
a first electrode, wherein the PDLC layer is a first PDLC layer on the first electrode; and
a second PDLC layer supporting the first electrode.

17. The solar cell of claim 1, wherein
the second electrode includes a light-reflective material, and
the light-reflective material is a metal layer.

* * * * *